(12) United States Patent
Lee et al.

(10) Patent No.: US 10,541,151 B1
(45) Date of Patent: Jan. 21, 2020

(54) DISPOSABLE LASER/FLASH ANNEAL ABSORBER FOR EMBEDDED NEUROMORPHIC MEMORY DEVICE FABRICATION

(71) Applicant: International Business Machines Corporation, Armonk, NY (US)

(72) Inventors: Kam-Leung Lee, Putnam Valley, NY (US); Deborah A. Neumayer, Danbury, CT (US); Son Nguyen, Schenectady, NY (US); Martin M. Frank, Dobbs Ferry, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/033,384

(22) Filed: Jul. 12, 2018

(51) Int. Cl.
| | |
|---|---|
| H01L 21/20 | (2006.01) |
| H01L 21/324 | (2006.01) |
| H01L 21/768 | (2006.01) |
| H01L 21/02 | (2006.01) |
| H01L 49/02 | (2006.01) |
| H01L 23/522 | (2006.01) |
| H01L 45/00 | (2006.01) |
| G06N 3/063 | (2006.01) |
| H01L 27/11502 | (2017.01) |
| H01L 43/02 | (2006.01) |

(52) U.S. Cl.
CPC ...... H01L 21/324 (2013.01); H01L 21/02118 (2013.01); H01L 21/76849 (2013.01); H01L 21/76895 (2013.01); H01L 23/5222 (2013.01); H01L 28/40 (2013.01); G06N 3/0635 (2013.01); H01L 27/11502 (2013.01); H01L 43/02 (2013.01); H01L 45/06 (2013.01); H01L 45/08 (2013.01)

(58) Field of Classification Search
CPC ............. H01L 21/324; H01L 21/02118; H01L 21/76849; H01L 21/76895; H01L 23/5222; H01L 27/228; H01L 28/40; H01L 43/12
USPC ...................................... 438/3, 396; 257/421
See application file for complete search history.

(56) References Cited

U.S. PATENT DOCUMENTS

| | | | |
|---|---|---|---|
| 5,602,965 | A | 2/1997 | Fu |
| 6,635,541 | B1 | 10/2003 | Talwar et al. |
| 7,115,479 | B2 | 10/2006 | Liu et al. |
| 7,642,205 | B2 | 1/2010 | Timans |
| 7,871,943 | B2 | 1/2011 | Boescke et al. |
| 9,085,045 | B2 | 7/2015 | Scheer et al. |
| 9,349,609 | B2 | 5/2016 | Greene et al. |
| 2009/0016094 | A1* | 1/2009 | Rinerson ............. G11C 11/5685 365/148 |
| 2010/0013036 | A1 | 1/2010 | Carey |

(Continued)

*Primary Examiner* — Brook Kebede
(74) *Attorney, Agent, or Firm* — Scully, Scott, Murphy & Presser, P.C.; L. Jeffrey Kelly, Esq.

(57) ABSTRACT

A conformal disposable absorber is disclosed which is capable of providing efficient heat transfer to an embedded memory device during a localized absorber anneal, without adversary impacting the back-end-of-the-line (BEOL) structure. The disposable absorber is composed of an amorphous carbonitride material that can be designed to have a low reflection coefficient for laser/flash illumination, and a high extinction coefficient for efficient laser/flash illumination absorption. The disposable absorber is formed at a temperature of 400° C. or less.

16 Claims, 4 Drawing Sheets

(56) References Cited

U.S. PATENT DOCUMENTS

| | | |
|---|---|---|
| 2011/0254138 A1 | 10/2011 | Babich et al. |
| 2012/0190216 A1 | 7/2012 | Chan et al. |
| 2014/0063913 A1* | 3/2014 | Kawashima ....... G11C 13/0007 365/148 |
| 2016/0005749 A1 | 1/2016 | Li et al. |
| 2016/0379830 A1 | 12/2016 | Dasgupta et al. |

\* cited by examiner

DISPOSABLE LASER/FLASH ANNEAL ABSORBER FOR EMBEDDED NEUROMORPHIC MEMORY DEVICE FABRICATION

BACKGROUND

The present application relates to a method of fabricating a memory device embedded in a back-end-of-the-line (BEOL) structure for use in a neuromorphic computing system. More particularly, a conformal disposable absorber is disclosed which is capable of providing efficient heat transfer to an embedded memory device during a localized absorber anneal, without adversary impacting the BEOL structure.

Neuromorphic computing systems, also referred to as artificial neural networks, are computational systems that permit electronic systems to essentially function in a manner analogous to that of biological brains. Neuromorphic computing systems do not generally utilize a traditional digital model of manipulating 0s and 1s. Instead, neuromorphic computing systems create connections between processing elements that are roughly functionally equivalent to neurons of a biological brain.

Neuromorphic computing systems may include memory devices that are embedded in a back-end-of-the-line (BEOL) structure. Examples of memory devices that can be employed in neuromorphic computing systems and embedded in a BEOL structure may include ferroelectric (FE) memory, resistive random access memory (ReRAM), magnetoresistive random access memory (MRAM), and/or phase change random access memory (PRAM).

In the fabrication of memory devices that are embedded in a back-end-of-the-line (BEOL) structure, a high temperature thermal anneal such as, a flash anneal or rapid thermal anneal, may be useful in order to optimize one or more elements of the embedded memory device. For example, FE memory devices including a stack of $TiN/HfO_2/TiN$ require a high temperature rapid thermal anneal budget (greater than 600° C./1 second) to enable $HfO_2$ to recrystallize to exhibit a ferroelectric capacitance behavior. The high thermal anneal budget requirement is incompatible with the elements of the BEOL structure.

In addition to using thermal anneals, a high temperature (about 1000° C.) nanosecond laser anneal, which has a much less thermal budget than rapid thermal annealing, has been used to provide $HfO_2$ with ferroelectric capacitance behavior. However, and given that the BEOL dielectric material is optically transparent to laser illumination, the direct illumination of the laser to the BEOL structure will create undesirable heating effects of the electrically conductive metal or metal alloy structure embedded in the interconnect dielectric material of the BEOL structure.

There is thus a need for providing a method which can be used to fabricate an embedded memory device in a BEOL structure that substantially, or even entirely, eliminates the aforementioned problems associated with annealing of such memory devices.

SUMMARY

A conformal disposable absorber is disclosed which is capable of providing efficient heat transfer to an embedded memory device during a localized absorber anneal, without adversary impacting the back-end-of-the-line (BEOL) structure. The disposable absorber is composed of an amorphous carbonitride material that can be designed to have a low reflection coefficient for laser/flash illumination, and a high extinction coefficient for efficient laser/flash illumination absorption. The disposable absorber is formed at a temperature of 400° C. or less.

In one aspect of the present application, a method of forming a structure including a memory device embedded in a back-end-of-the-line (BEOL) structure is provided. In one embodiment, the method includes providing a lower interconnect level including at least one first electrically conductive structure embedded in a memory device area of a first interconnect dielectric material layer. A memory device is then formed above the at least one first electrically conductive structure, and thereafter a conformal disposable absorber composed of an amorphous carbonitride material is formed surrounding at least an upper portion of the memory device. An anneal is then performed to predominately heat the disposable absorber locally and to activate the memory device. After the anneal, the disposable absorber is removed. Next, an upper interconnect level is formed above the lower interconnect level and the memory device.

In another aspect of the present application, a method of forming a structure including a metal-insulator-metal capacitor embedded in back-end-of-the-line (BEOL) structure is provided. In one embodiment, the method includes providing a lower interconnect level including at least one first electrically conductive structure embedded in a first interconnect dielectric material layer. A metal-insulator-metal capacitor (MIM cap) is then formed above the at least one first electrically conductive structure, and thereafter a conformal disposable absorber composed of an amorphous carbonitride material is formed surrounding at least an upper portion of the metal-insulator-metal capacitor. An anneal is then performed to predominately heat the disposable absorber locally and to activate the memory device. After the anneal, the disposable absorber is removed. Next, an upper interconnect level is formed above the lower interconnect level and the MIM cap.

In yet another aspect of the present application, a structure is provided. In one embodiment, the structure includes a lower interconnect level including at least one first electrically conductive structure embedded in a memory device area of a first interconnect dielectric material layer. A memory device is located above the at least one first electrically conductive structure, and a conformal disposable absorber composed of an amorphous carbonitride material surrounds at least an upper portion of the memory device.

DETAILED DESCRIPTION

Figure 1:
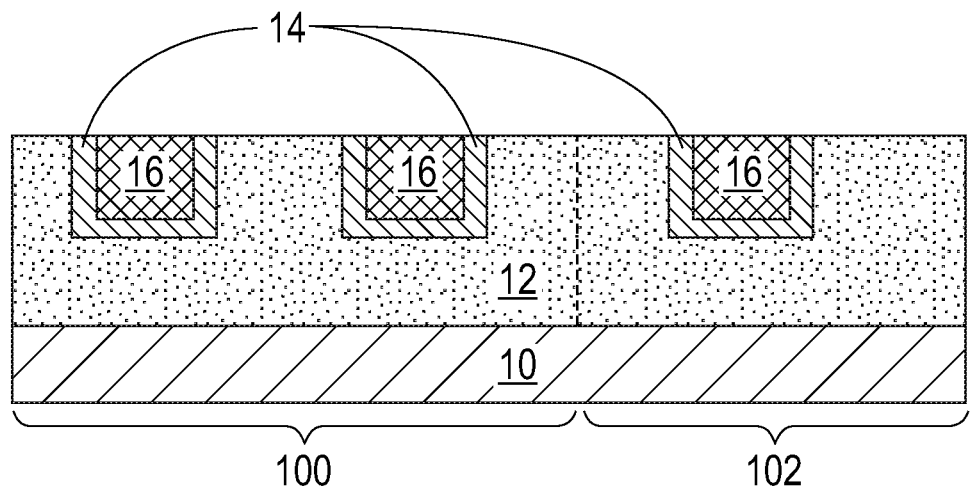
FIG. 1 is a cross sectional view of an exemplary structure of the present application during an early stage of fabrication, and including a lower interconnect level containing a plurality of first electrically conductive structures embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure of the present application during an early stage of fabrication, and including a lower interconnect level containing a plurality of first electrically conductive structures 16 embedded in a first interconnect dielectric material layer 12. As is shown, the exemplary structure includes a first device area in which non-memory devices (i.e., non-memory device area 100) such as, for example, logic devices, are present, and a second device area in which an embedded memory device will be subsequently formed (i.e., memory device area 102). When logic devices are present in the non-memory device area 100, the logic devices would be located in a front-end-of-the-line (FEOL) level 10 that would be located beneath the interconnect dielectric material layer 12. A diffusion barrier liner 14 is typically present between each electrically conductive structure 16 and the first interconnect dielectric material layer 12.

The first interconnect dielectric material layer 12 may include an inorganic dielectric material or an organic dielectric material. In one embodiment, the first interconnect dielectric material layer 12 may be non-porous. In another embodiment, the first interconnect dielectric material layer 12 may be porous. Some examples of suitable dielectric materials that may be used as the first interconnect dielectric material layer 12 include, but are not limited to, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first interconnect dielectric material layer 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric material layer 12 may vary depending upon the type of dielectric material(s) used. In one example, the first interconnect dielectric material layer 12 may have a thickness from 50 nm to 1000 nm. Other thicknesses that are lesser than, or greater than, the aforementioned thickness range may also be employed in the present application for the thickness of the first interconnect dielectric material layer 12. The first interconnect dielectric material layer 12 may be formed utilizing any deposition process including, but not limited to, chemical vapor deposition (CVD), plasma enhanced chemical vapor deposition (PECVD) or spin-on coating.

The first interconnect dielectric material layer 12 is then processed to include a plurality of openings (not shown). A single opening and/or a plurality of openings can be formed into each of the non-memory device area 100 and the memory device area 102. In the illustrated embodiment of FIG. 1, a single opening is formed into the memory device area 102 of the first interconnect dielectric material layer 12, while two openings are formed into the non-memory device area 100 of the first interconnect dielectric material layer 12. The openings, which are used to house the first electrically conductive structures 16, may extend partially through the first interconnect dielectric material layer 12 (illustrated embodiment of FIG. 1) or entirely through the first interconnect dielectric material layer 12 (not shown in the drawings of the present application). The openings may be via openings, line openings or a combined via and line opening. The openings may be formed by lithography and etching.

In some embodiments, and prior to forming the openings, a hard mask material layer (not shown) is formed on the first interconnect dielectric material layer 12. The hard mask material may be composed of a dielectric oxide, a dielectric nitride and/or a dielectric oxynitride. In one example, the hard mask material may be composed of silicon dioxide and/or silicon nitride. The hard mask material layer may be formed utilizing a deposition process such as, for example, chemical vapor deposition (CVD) or plasma enhanced chemical vapor deposition (PECVD). Openings (as defined above) can then be formed through the hard mask material layer and into the first interconnect dielectric material layer 12 by lithography and etching. The thus patterned hard mask material layer may be removed after forming the openings utilizing any well known material removal process.

A diffusion barrier material layer is then formed into each opening and on the topmost surface of the first interconnect dielectric material layer 12. The diffusion barrier material layer includes a diffusion barrier material (i.e., a material that serves as a barrier to prevent a conductive material such as copper from diffusing there through) such as, for example, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed. In some embodiments, the diffusion barrier material layer may have a thickness from 2 nm to 50 nm; although other thicknesses for the diffusion barrier material layer are contemplated and can be employed in the present application. The diffusion barrier material layer can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

An electrically conductive metal or metal alloy is formed into each opening and, is present, on the diffusion barrier material layer. Examples of electrically conductive metals that may be used in the present application include copper (Cu), aluminum (Al), or tungsten (W), while an example of an electrically conductive metal alloy is a Cu—Al alloy. Typically, copper or a copper alloy is used in providing each first electrically conductive structure 16. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy.

Following the deposition of the electrically conductive metal or metal alloy, a planarization process such as, for example, chemical mechanical polishing (CMP) and/or grinding, can be used to remove the electrically conductive metal or metal alloy (i.e., overburden material) and the diffusion barrier material layer that is present outside each of the openings and from the topmost surface of the first interconnect dielectric material layer 12. The electrically conductive metal or metal alloy remaining in each opening is referred to herein as a first electrically conductive structure 16, while the diffusion barrier material layer that remains in each opening is referred to herein as diffusion barrier liner 14. The planarization stops on a topmost surface of the first interconnect dielectric material layer 12. At this point of the present application, and as shown in FIG. 1, each first electrically conductive structure 16 has a topmost surface that is coplanar with a topmost surface of the first interconnect dielectric material layer 12, as well as, the topmost surfaces of the diffusion barrier liner 14. As is shown, a diffusion barrier liner 14 is located between each first electrically conductive structure 16 and the first interconnect dielectric material layer 12. In some embodiments (not specifically shown), the diffusion barrier liner 14 may be omitted from the exemplary structure. Collectively, the first interconnect dielectric material layer 12, the diffusion barrier liners 14 (if present), and the first electrically conductive structures 16 form a lower interconnect level of the structure of the present application.

Figure 2:
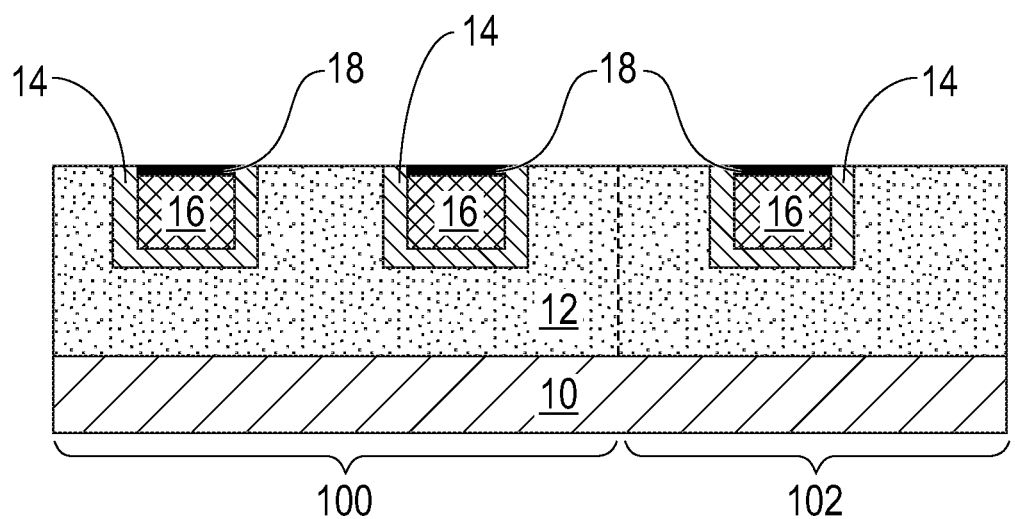
FIG. 2 is a cross sectional view of the exemplary structure of FIG. 1 after forming a metal capping layer on a physically exposed surface of each first electrically conductive structure.

Referring now to FIG. 2, there is illustrated the exemplary structure of FIG. 1 after forming a metal capping layer 18 on a physically exposed surface of each first electrically conductive structure 16. In some embodiments, this step of the present application may be omitted. When present, and as is illustrated in FIG. 2, the metal capping layer 18 may be formed on a recessed surface of the first electrically conductive structures 16. In other embodiments (not specifically shown) the metal capping layer 18 may be formed on a non-recessed surface of each of the first electrically conductive structures 16. Recessing of the first electrically conductive structures 16 may be performed utilizing an etching process that is selective in removing the electrically conductive metal or metal alloy that provides the first electrically conductive structures 16.

When present, the metal capping layer 18 may include cobalt (Co), iridium (Ir), ruthenium (Ru), or manganese (Mn) alone, or their alloys with at least one of W, B, P, Mo and Re. In one embodiment, the metal capping layer 18 may be composed of Co or a CoWP alloy. The metal capping layer 18 may have a thickness from 2 nm to 25 nm; other thicknesses are possible and can be used in the present application as the thickness of the metal capping layer 18.

The metal capping layer 18 is typically, but not necessary always, formed utilizing a selective deposition process including for example, a catalytic plating process or an electroless plating process. When a selective deposition process is used, the metal capping layer 18 is formed on the first electrically conductive structures 16; the metal capping layer 18 may also extend onto the diffusion barrier liner 14. In some embodiments, a non-selective deposition process such as sputtering, ALD, CVD or PVD can be used in forming the metal capping layer. In such an embodiment, the metal capping layer is formed on all physically exposed surfaces of the lower interconnect level (12/14/16). An etch back process, a planarization process (such as, for example, chemical mechanical polishing), or patterning process (such as, for example, lithography and etching) may follow the deposition of the metal capping layer 18.

Figure 3:
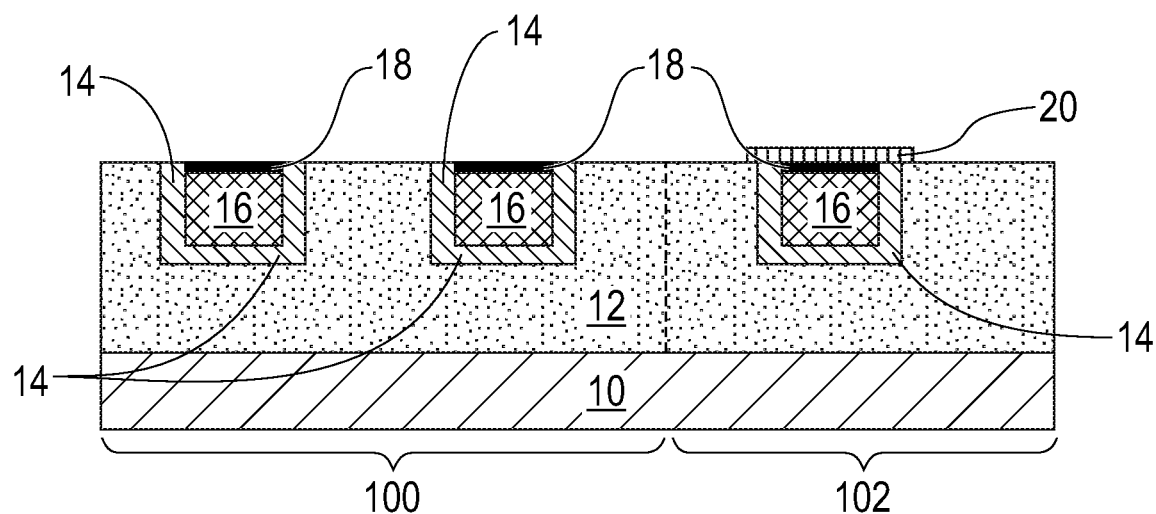
FIG. 3 is a cross sectional view of the exemplary structure of FIG. 2 after forming a landing pad above each first electrically conductive structure present in a memory device area of the structure.

Referring now to FIG. 3, there is illustrated the exemplary structure of FIG. 2 after forming a landing pad 20 above each first electrically conductive structure 16 present in the memory device area 102 of the structure. The landing pad 20 typically includes at least one metal nitride such as, for example, TaN and/or TiN. The landing pad 20 may be formed utilizing a deposition such as, for example, sputtering, CVD, PECVD, or ALD. A patterning process may follow the deposition of the landing pad 20. The landing pad 20 may have a thickness from 5 nm to 50 nm, other thicknesses are possible and can be used in the present application as the thickness of the landing pad 20.

Figure 4:
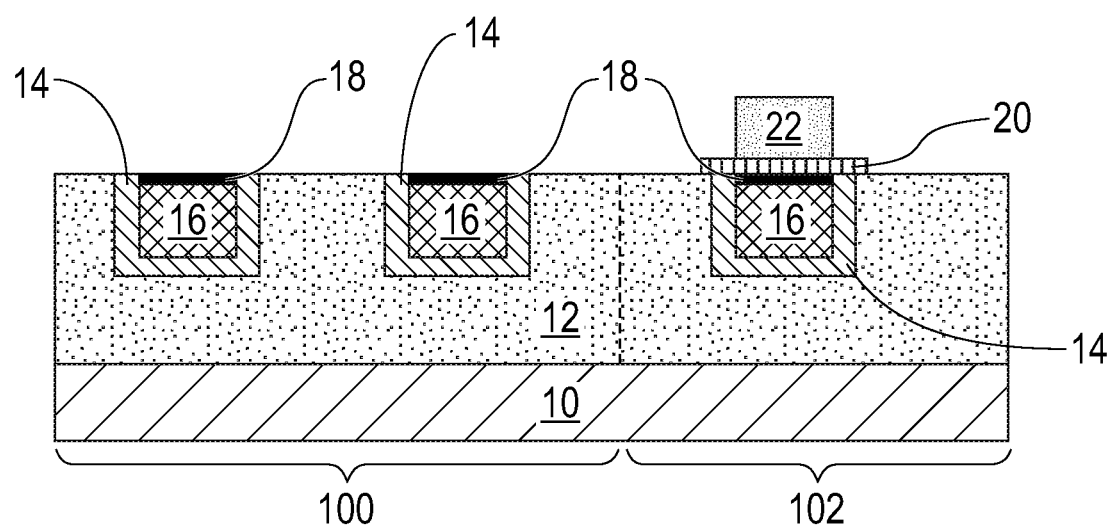
FIG. 4 is a cross sectional view of the exemplary structure of FIG. 3 after forming a memory device on the landing pad.

Referring now to FIG. 4, there is illustrated the exemplary structure of FIG. 3 after forming a memory device 22 on the landing pad 20. The memory device 22 that can be used in the present application is a non-volatile memory such as, for example, a ferroelectric memory (FE) device, a resistive random access memory (ReRAM) device, a magnetoresistive random access memory (MRAM) device, or a phase change random access memory (PRAM) device. When more than one first electrically conductive structure 16 is present in the memory device area 102 of the structure, the memory device formed atop the first electrically conductive structure 16 in the memory device area 102, may be of a same, or a different type.

The FE memory device, which can be used as memory device 22, is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. The bottom and top electrodes may be composed of a metal or metal nitride. For example, TiN may be used as the material for both the bottom and top electrodes. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y. The FE material stack can be formed by deposition of the various material layers, and then patterning the material layers by lithography and etching.

The ReRAM device, which can be used as memory device 22, is a random access memory that typically includes a material stack of, from bottom to top, a bottom electrode, a metal oxide that can exhibit a change in electron localization, and a top electrode. The bottom and top electrodes may be composed of a metal or metal nitride. For example, TiN may be used as the material for both the bottom and top electrodes. The metal oxide may include oxides of nickel, zirconium, hafnium, iron, or copper. The ReRAM material stack can be formed by deposition of the various material layers, and then patterning the material layers by lithography and etching.

The MRAM device, which can be used as memory device 22, is a random access memory, that includes a magnetic tunnel junction (MTJ) structure The magnetic tunnel junction (MTJ) structure may include a reference layer, a tunnel barrier, and a free layer. The reference layer has a fixed magnetization. The reference layer may be composed of a metal or metal alloy that includes one or more metals exhibiting high spin polarization. In alternative embodiments, exemplary metals for the formation of the reference layer include iron, nickel, cobalt, chromium, boron, and manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The free layer of the MTJ structure is composed of a magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

The MTJ structure of the MRAM device can be formed by deposition of the various material layers, and then patterning the material layers by lithography and etching.

The PRAM device, which can be used as memory device 22, is a random access memory that typically includes a material stack of, from bottom to top, a bottom electrode, a phase change memory material that exhibits a change in atomic order (from crystalline to amorphous or vice versa), and a top electrode. The bottom and top electrodes may be composed of a metal or metal nitride. For example, TiN may be used as the material for both the bottom and top electrodes. The phase change memory material may include a chalcogenide glass such as, for example, $Ge_2Sb_2Te_5$ or $Ge_2Bi_2Te_6$. The PRAM stack can be formed by deposition of the various material layers, and then patterning the material layers by lithography and etching.

Figure 5:
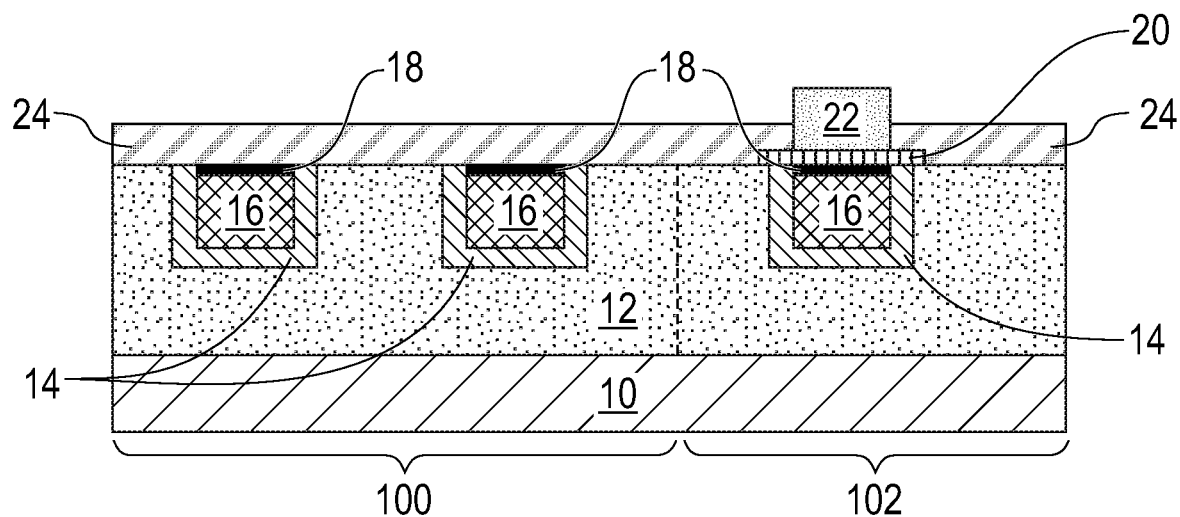
FIG. 5 is a cross sectional view of the exemplary structure of FIG. 4 after forming a dielectric capping layer.

Referring now to FIG. 5, there is illustrated the exemplary structure of FIG. 4 after forming a dielectric capping layer 24. In some embodiments, dielectric capping layer 24 can be omitted. Dielectric capping layer 24 is formed on physically exposed surfaces of the lower interconnect level (12/14/16). In some embodiments, the dielectric capping layer 24 is a barrier layer that may serve as a thermal break between the annealing process and the first electrically conductive structures 16. The dielectric capping layer may or may not cover the entirety of the memory device 22. FIG. 5 illustrates an embodiment in which the dielectric capping layer 24 laterally surrounds a lower portion of the memory device 22, and has a height that is less than the height of the memory device. In other embodiments, the dielectric capping layer 24 may have a height that is equal to, or even greater than, the height of the memory device 22.

The dielectric capping layer 24 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the dielectric capping layer 24 may be formed utilizing a deposition process such as, for example, CVD, PECVD, ALD, PVD, chemical solution deposition or evaporation. A recessing process may or may not follow the deposition of the dielectric capping layer 24. The dielectric capping layer 24 may have a thickness from 10 nm to 100 nm; other thicknesses are possible and can be used in the present application as the thickness of the dielectric capping layer 24.

In some embodiments of the present application, the dielectric capping layer 24 can be formed prior to forming the memory device 22. In such an embodiment, a patterning process is used to provide an opening within a blanket layer of dielectric capping material that physically exposes a surface of the landing pad 20. The memory device 22 is then formed into the opening.

Figure 6:
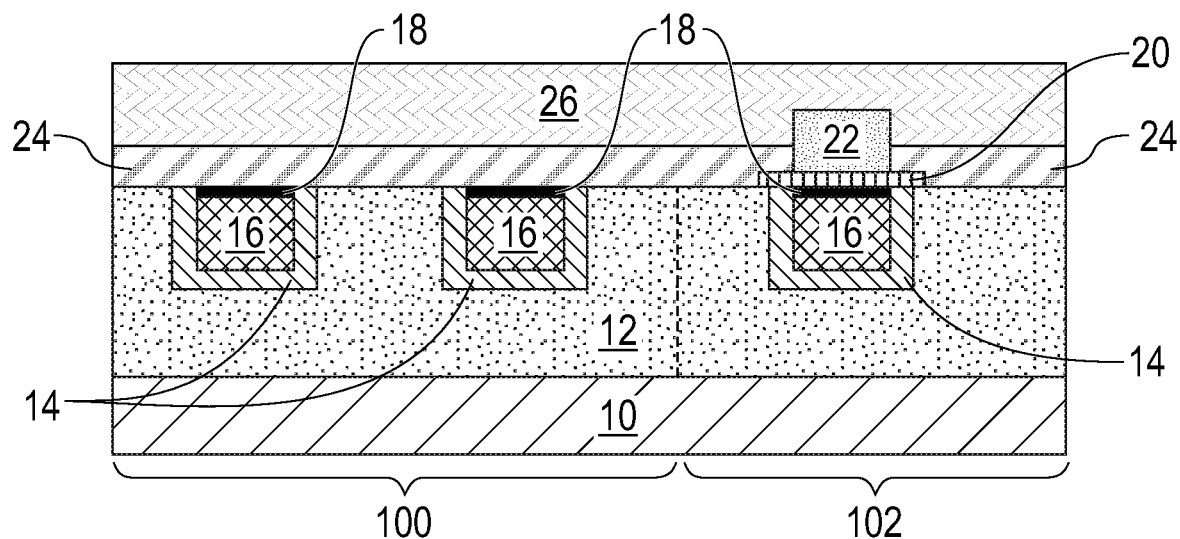
FIG. 6 is a cross sectional view of the exemplary structure of FIG. 5 after forming a conformal disposable absorber on the dielectric capping layer.

Referring now to FIG. 6, there is illustrated the exemplary structure of FIG. 5 after forming a disposable absorber 26 on the dielectric capping layer 24. In some embodiments and as shown in FIG. 6, the disposable absorber 26 surrounds an upper portion of the memory stack 22. The presence of the disposable absorber 26 allows sufficient heating of the elements within the BEOL structure without causing any deleterious effects on the first electrically conductive structures 16.

The disposable absorber 26 is composed of an amorphous carbonitride material that generally has a low reflection coefficient for laser/flash illumination, and a high extinction coefficient for efficient laser/flash illumination absorption. The term "amorphous" when used in conjunction with the carbonitride material denotes that the carbonitride material lacks a well defined crystal structure. Moreover, while there may be local ordering of the atoms or molecules in the amorphous carbonitride material, no long-term ordering is present. Typically, the disposable absorber 26 is composed of an amorphous carbonitride material having a reflection coefficient of 0.15 or less, and an extinction coefficient of 0.2 or greater.

The amorphous carbonitride material that can be used as the disposable absorber 26 also has a minimum of hydrocarbon content as observed by FTIR. By "minimum of hydrocarbon content as observed by FTIR" it is meant a normalized hydrocarbon content less than 3 as defined by integrating under the C—H stretching peak in the FTIR spectra from 3170-2750 cm$^{-1}$ and dividing the integrated peak area by the film thickness in microns.

The high extinction coefficient and low reflection coefficient are indicative of greater absorptivity of the amorphous carbonitride material, and less transparency which minimizes reflectance variations from the BEOL structure. Additionally, the amorphous carbonitride material can be optimized to possess minimal stress in order to avoid delamination during deposition, and anneals. The amorphous carbonitride material can also be designed to be an efficient microwave absorber thus it can be used during a microwave anneal.

The disposable absorber 26 having the aforementioned properties can be deposited at a temperature of 450° C. or less. In one embodiment, disposable absorber 26 having the aforementioned properties can be deposited at temperature from 250° C. to 400° C.

The disposable absorber 26 having the above properties can be produced using a combination of at least a carbon precursor source, and a nitrogen source. An oxidant is also typically, but not necessarily always, employed to facilitate decomposition, fragmentation and hydrogen removal. Such a combination of gases can be referred to herein as a reactant gas mixture. The reactant gas mixture may further include an inert gas such as helium or argon. The inert gas may be introduced as a separate component of the reactant gas mixture or it can be present within at least one of the carbon precursor source, the nitrogen source and the oxidant. In some embodiments, the disposable absorber 26 having the above properties can be produced using a single carbonitride precursor that includes both carbon and nitrogen in the molecule. An oxidant is also typically, but not necessarily always, employed in this embodiment of the invention as well.

The carbon precursor source that can be employed in the invention is selected from alkanes, alkenes, alkynes and mixtures thereof. The carbon precursor sources may be linear, branched, and/or cyclic. In one embodiment, the carbon precursor sources have a minimal C/H ratio. By "minimal C/H ratio" it is meant less than 3 hydrogens for every carbon atom in the precursor.

The term "alkane" denotes a chemical compound that consists only of the elements carbon and hydrogen (i.e., hydrocarbons), wherein these atoms are linked together exclusively by single bonds (i.e., they are saturated compounds). In one embodiment of the invention, the alkane includes from 1 to 22, typically from 1 to 16, more typically, from 1 to 12 carbon atoms. The term "alkene" denotes an unsaturated chemical compound containing at least one carbon-to-carbon double bond. In one embodiment, the alkene is an acyclic alkene, with only one double bond and no other functional groups. In such an embodiment, the acylic alkene forms a homologous series of hydrocarbons with the general formula $C_nH_{2n}$, wherein n is an integer from 2 to 22, typically 2 to 16, more typically 2 to 12 carbon atoms. The term "alkyne" denotes a hydrocarbon that has a triple bond between two carbon atoms, with the formula $C_nH_{2n-2}$, wherein n is an integer from 2 to 22, typically 2 to 16, more typically 2 to 12 carbon atoms. Alkynes are traditionally known as acetylenes.

Some examples of typical carbon precursor sources that can be employed in forming the disposable absorber 26 include, but are not limited to ethylene, propylene, butene, acetylene, and/or methyl acetylene. In one embodiment, propylene is employed as the carbon precursor source.

The nitrogen source that can be employed in forming the disposable absorber 26 can be selected from nitriding sources including, but not limited to nitrogen, ammonia, amines, azides, and/or hydrazines. In one embodiment, nitrogen ($N_2$) and/or ammonium ($NH_3$) is employed as the nitrogen source. The oxidant that can be employed in forming the disposable absorber 26 can be selected from oxidizing sources including oxygen, nitrous oxide, carbon dioxide, carbon monoxide, water, and/or ozone. In one embodiment of the invention, oxygen is employed as the oxidant.

Although any combination of carbon precursor source, nitrogen source and oxidant can be employed in forming the disposable absorber 26, one embodiment of the present application employs propylene as the carbon precursor source, nitrogen ($N_2$) or ammonium ($NH_3$) as the nitrogen source, and oxygen ($O_2$) as the oxidant. Such a reactant gas mixture can be used as is or diluted with an inert gas such as helium or argon.

In one embodiment, as mentioned above, a single carbonitride precursor that includes both carbon and nitrogen in the molecule can be used to form the disposable absorber 26. One example of such a single carbonitride precursor that can be employed in the present application invention is acetonitrile. Other single carbonitride precursors beside acetonitrile can be used as long as the precursor includes carbon and nitrogen atoms therein. When a single carbonitride precursor is employed, an oxidant, as described above can also be used. The single carbonitride precursor can be used as is or diluted with an inert gas such as helium or argon. Other potential single carbonitride precursors include heterocyclic compounds such as pyrrole, imidazole, pyrazole, pyridine, pyrazine, pyrimidine, pyridazine, pyrazinyl, imidazolyl, pyrimidinyl, piperazine, triazine, amines such as methylamine, diamine ethane, diamine methane, aminoethane, aminopropane, azo, hydrzo, dimethylhydrazine, alkylazo compounds such as diethyldiazene, and amidines including acetamidine.

The gases may be introduced separately into a reactor chamber of a deposition tool, or some, or all of the gases may be admixed prior to being introduced into a reactor chamber of a deposition tool. Typically, the various gases are admixed in a mixing system prior to being introduced into the reactor chamber of a deposition tool. The reactor chamber of the deposition tool typically includes a substrate holder.

The gases may be introduced in a deposition tool in different stochiometries. In some embodiments, the carbon source may be introduced at a flow rate between 50 sccm and 2000 sccm, the nitrogen source may be introduced at a flow rate between 10 sccm and 50000 sccm, and the oxidant may be introduced at a flow rate between 10 sccm and 500 sccm. The inert gas may be introduced at a flow rate from 50 sccm to 50000 sccm.

In some further embodiments, the process pressure used in forming the disposable absorber 26 can be varied from 1 torr to 8 torr. In yet another embodiment of the invention, the substrate temperature during the deposition process can be fixed at 400° C. or 350° C. In an even further embodiment of the invention, the plasma can be generated using either a low frequency radio frequency (LFRF) plasma source at 100 MHz or a high frequency radio frequency HFRF plasma source at 13.56 GHz. The process pressure, substrate temperature and power used in generating the plasma are exemplary and other conditions are possible provided the selected conditions are capable of forming a disposable absorber 26 having the properties mentioned above.

The disposable absorber 26 is a conformal film or coating that follows the topography of the underlying material layers of the memory device 22 and has a vertical thickness that is nearly the same as the lateral thickness. The conformality of the disposable absorber 26 provides better transfer of heat to the memory device 22 without adversely impacting the first electrically conductive structures 16 embedded in the first interconnect dielectric material layer 12 during a subsequently performed localized heating of the disposable absorber 26.

Figure 7:
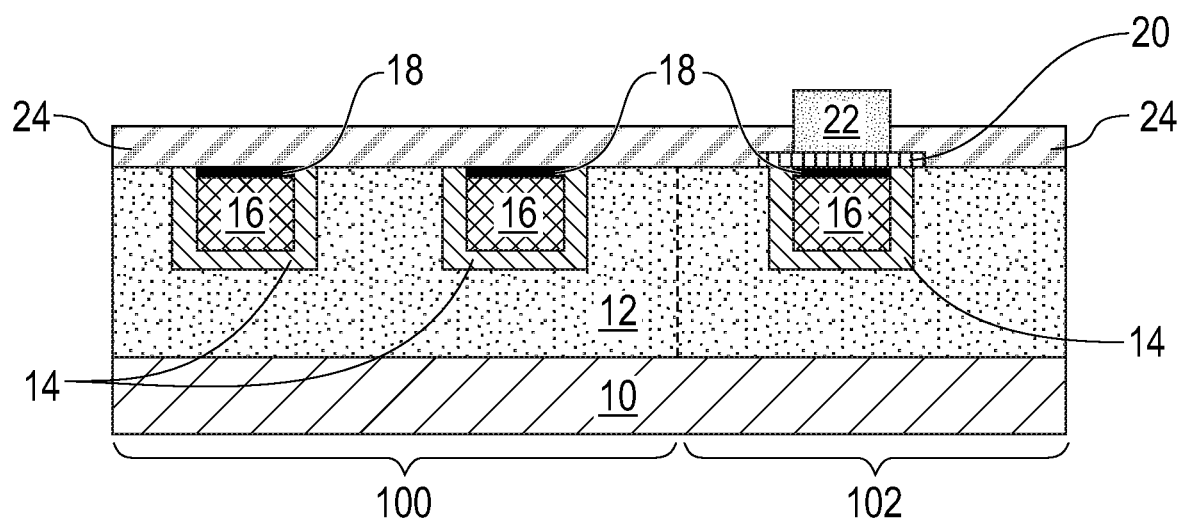
FIG. 7 is a cross sectional view of the exemplary structure of FIG. 6 after performing an anneal to predominately heat the disposable absorber locally and to activate the memory device, and thereafter removing the disposable absorber.

Referring now to FIG. 7, there is illustrated the exemplary structure of FIG. 6 after performing an anneal to predominately heat the disposable absorber 26 locally and to activate the memory device 22, and removing the disposable absorber 26 after transferring of the heat from the locally heated disposable absorber 26 to the memory device 22. The term "to predominately heat the disposable absorber 26 locally" denotes that the anneal mainly (90% or greater) heats the disposable absorber 26, while minimizing the heating of other portions of the structure. Examples of anneals that may be employed include a nanosecond to millisecond flash anneal, a laser anneal, or a microwave anneal. The anneal, which is used to active elements (such as, the element(s) of the memory device 22) of the exemplary structure through transfer of heat from the locally heated disposable absorber 26, may be performed at a temperature of 400° C.-1000° C. or greater. The conditions for each anneal are well known to those skilled in the art and due to the disposable absorber 26 are not limited in the present application. In one example, and when a flash anneal is employed, the flash anneal quickly heats the disposable absorber 26 locally to a temperature of 400° C.-1000° C. or greater. In another example, and when a laser anneal is employed, the laser anneal includes any laser that can heat the disposable absorber 26 locally to a temperature of 400° C.-1000° C. or greater. In a further example, and when a microwave anneal is employed, the microwave anneal includes any microwave emitter source that can heat the disposable absorber 26 locally to a temperature of 400° C.-1000° C. or greater.

The disposable absorber 26 is removed after heating of the disposable absorber 26 locally and activation of the memory device 22 through heat transfer have performed. The disposable absorber 26 may be removed utilizing a stripping process such as, for example, plasma oxygen ashing and/or $N_2/H_2$ stripping and $NH_3$ etching.

Figure 8:
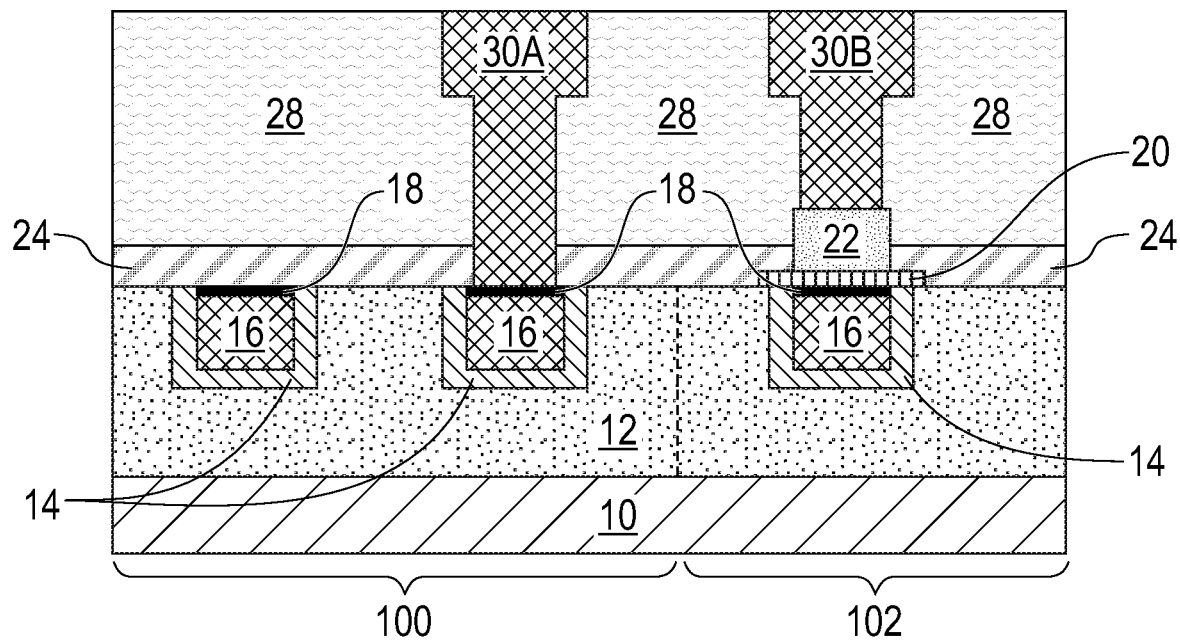
FIG. 8 is a cross sectional view of the exemplary structure of FIG. 7 after forming an upper interconnect level containing a plurality of second electrically conductive structures embedded in a second interconnect dielectric material layer.

Referring now to FIG. 8, there is illustrated the exemplary structure of FIG. 7 after forming an upper interconnect level containing a plurality of second electrically conductive structures 30A, 30B embedded in a second interconnect dielectric material layer 28.

The second interconnect dielectric material layer 28 may include one of the dielectric materials mentioned above for the first interconnect dielectric material layer 12. In one embodiment, second interconnect dielectric material layer 28 is composed of a same dielectric material as the first interconnect dielectric material layer 12. In another embodiment, the second interconnect dielectric material layer 28 is composed of a different dielectric material than the first interconnect dielectric material layer 12. The second interconnect dielectric material layer 28 may be formed by utilizing one of the deposition processes mentioned above in forming the first interconnect dielectric material layer 12. The second interconnect dielectric material layer 28 may have a thickness within the thickness range mentioned above for the first dielectric material layer 12.

Openings are then formed into the second dielectric material layer 44 and the dielectric capping layer 24. The openings can be formed by lithography and etching. At least one of the openings physically exposes a topmost surface of the memory device 22 in the memory device area 102, while another of the openings contacts the metal capping layer 18 in the non-memory device area 100. A diffusion barrier material (not shown) and/or an electrically conductive metal or metal alloy layer (not shown) is then formed on the physically exposed topmost surface of the second interconnect dielectric material layer 28 and within the openings. By way of one example and in the illustrated embodiment, only the electrically conductive metal or metal alloy layer is formed into the openings.

The diffusion barrier material layer may include one of the diffusion barrier materials mentioned above for diffusion barrier liner 14. In one embodiment, diffusion barrier material layer is composed of a same diffusion barrier material as diffusion barrier liner 14. In another embodiment, diffusion barrier material layer is composed of a different diffusion barrier material than diffusion barrier liner 14. The diffusion barrier material layer may be deposited utilizing one of the deposition processes mentioned above in forming diffusion barrier liner 14. The diffusion barrier material layer may have a thickness within the thickness range mentioned above for diffusion barrier liner 14.

The electrically conductive metal or metal alloy layer may include one of the electrically conductive metals or metal alloys mentioned above for the first electrically conductive structures 16. In one embodiment, the electrically conductive metal or metal alloy layer is composed of a same electrically conductive metal or metal alloy as the first electrically conductive structures 16. In another embodiment, the electrically conductive metal or metal alloy layer is composed of a different electrically conductive metal or metal alloy than the first electrically conductive structures 16. The electrically conductive metal or metal alloy layer may be deposited utilizing one of the deposition processes mentioned above in forming the first electrically conductive structures 16.

Following the deposition of the diffusion barrier material layer and/or the electrically conductive metal or metal alloy, a planarization process such as, for example, chemical mechanical polishing, can be employed to form the structure shown in FIG. 8. In FIG. 8, the electrically conductive metal or metal alloy that remains in each of the openings in the second interconnect dielectric material layer 28 after planarization is referred to as a second electrically conductive structure 30A, 30B. The second electrically conductive structure 30A is present in the non-memory device area 100 of the structure, while the second electrically conductive structure 30B is present in the memory device area 102 of the structure. If present, the diffusion barrier material layer that remains in the openings in the second interconnect dielectric material layer 28 may be referred to as a second diffusion barrier liner; in FIG. 8 the second diffusion barrier liner has been omitted.

Although the disposable absorber 26 is described and illustrated for use with embedded BEOL memory devices, the disposable absorber 26 may be used when other non-memory devices such, as for example, metal-insulator-metal (MIM) capacitors that are buried within one of the interconnect levels of an interconnect structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a structure, the method comprising:
providing a lower interconnect level including at least one first electrically conductive structure embedded in a memory device area of a first interconnect dielectric material layer;
forming a memory device above the at least one first electrically conductive structure;
forming a conformal disposable absorber composed of an amorphous carbonitride material surrounding at least an upper portion of the memory device;
performing an anneal to predominately heat the disposable absorber locally and to activate the memory device;
removing the disposable absorber; and
forming an upper interconnect level above the lower interconnect level and the memory device.

2. The method of claim 1, wherein the amorphous carbonitride material has a reflection coefficient of 0.15 or less, and an extinction coefficient of 0.2 or greater.

3. The method of claim 2, wherein the amorphous carbonitride material has a minimum of hydrocarbon content as observed by FTIR.

4. The method of claim 1, further comprising forming, prior to the forming of the memory device, a landing pad above the at least one first electrically conductive structure.

5. The method of claim 4, wherein the at least one first electrically conductive structure has a recessed surface.

6. The method of claim 5, wherein a metal capping layer is present on the recessed surface of the at least one first electrically conductive structure.

7. The method of claim 1, wherein the memory device comprises a ferroelectric (FE) memory device, a resistive random access memory (ReRAM) device, a magnetoresistive random access memory (MRAM), or a phase change random access memory (PRAM).

8. The method of claim 1, further comprising forming, prior to the forming of the disposable absorber, a dielectric capping layer surrounding at least a lower portion of the memory device.

9. The method of claim 1, wherein the upper interconnect level includes at least one second electrically conductive structure embedded in a second interconnect dielectric material layer, and contacting the memory device.

10. The method of claim 1, wherein the anneal is performed at a temperature of 400° C. to 1000° C. or greater.

11. The method of claim 10, wherein the anneal is a nanosecond to millisecond flash anneal, a laser anneal, or a microwave anneal.

12. A method of forming a structure, the method comprising:
providing a lower interconnect level including at least one first electrically conductive structure embedded in a first interconnect dielectric material layer;
forming a metal-insulator-metal capacitor above the at least one first electrically conductive structure;
forming a conformal disposable absorber composed of an amorphous carbonitride material surrounding at least an upper portion of the metal-insulator-metal capacitor;
performing an anneal to predominately heat the disposable absorber locally and to activate the memory device;
removing the disposable absorber; and
forming an upper interconnect level above the lower interconnect level and the metal-insulator-metal capacitor.

13. The method of claim 12, wherein the amorphous carbonitride material has a reflection coefficient of 0.15 or less, and an extinction coefficient of 0.2 or greater.

14. The method of claim 12, wherein the amorphous carbonitride material has a minimum of hydrocarbon content as observed by FTIR.

15. The method of claim 12, wherein the anneal is performed at a temperature of 400° C. to 1000° C. or greater.

16. The method of claim 15, wherein the anneal is a nanosecond to millisecond flash anneal, a laser anneal, or a microwave anneal.

* * * * *